(12) United States Patent
Chen et al.

(10) Patent No.: US 7,236,394 B2
(45) Date of Patent: Jun. 26, 2007

(54) TRANSISTOR-FREE RANDOM ACCESS MEMORY

(75) Inventors: Yi Chou Chen, Hsinchu (TW);
Wen-Jer Tsai, Hsinchu (TW);
Chih-Yuan Lu, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/464,938

(22) Filed: Jun. 18, 2003

(65) Prior Publication Data

US 2004/0257872 A1   Dec. 23, 2004

(51) Int. Cl.
*G11C 11/34* (2006.01)

(52) U.S. Cl. ............ 365/184; 365/185.01; 365/185.14

(58) Field of Classification Search ........... 365/185.02, 365/185.28, 185.29, 185.26, 185.01, 184
See application file for complete search history.

(56) References Cited

U.S. PATENT DOCUMENTS

| | | | |
|---|---|---|---|
| 3,530,441 A | 9/1970 | Ovshinsky | |
| 6,189,582 B1 | 2/2001 | Reinberg et al. | |
| 6,426,891 B1 * | 7/2002 | Katori | 365/175 |
| 6,449,190 B1 * | 9/2002 | Bill | 365/185.2 |
| 6,490,203 B1 * | 12/2002 | Tang | 365/185.22 |
| 6,545,898 B1 * | 4/2003 | Scheuerlein | 365/94 |
| 6,735,114 B1 * | 5/2004 | Hamilton et al. | 365/185.03 |
| 6,784,517 B2 * | 8/2004 | Kleveland et al. | 257/530 |
| 2003/0081451 A1 | 5/2003 | Lowrey et al. | |

* cited by examiner

*Primary Examiner*—Thong Q. Le
(74) *Attorney, Agent, or Firm*—Martine Penilla & Gencarella, LLP

(57) ABSTRACT

A memory core includes a bit line and a word line. The memory core also includes a core cell in electrical communication with the word line and the bit line. The core cell includes a threshold changing material. The threshold changing material is programmed to enable access to the core cell based upon a voltage applied to the word line. Methods for accessing a memory core cell also are described.

16 Claims, 8 Drawing Sheets

TRANSISTOR-FREE RANDOM ACCESS MEMORY

CROSS-REFERENCE TO RELATED APPLICATIONS

This application is related to the following applications: (1) U.S. patent application Ser. No. 10/465,120, filed on the same day as the instant application, and entitled "Method for Adjusting the Threshold Voltage of a Memory Cell"; and (2) U.S. patent application Ser. No. 10/465,012, filed on the same day as the instant application, and entitled "Multi-Level Memory Device and Methods for Programming and Reading the Same." The disclosures of these related applications are incorporated herein by reference.

BACKGROUND OF THE INVENTION

The present invention relates generally to memory devices and, more particularly, to a memory cell structure not requiring access transistors.

Typical memory cells include a steering element, e.g., one or more transistors, to access each cell. The access transistors, which may also be diodes, provide access for the word lines to the bit lines of the memory cell. That is, the access transistors act as a pass gate to provide access for the word line to the bit line in order to read and write data to a memory cell. With respect to chalcogenide memory cells, the current/voltage required to program the chalcogenide memory cells is relatively high as compared to the operating current/voltage. However, the access transistors may not be able to handle the programming voltages, thereby limiting the current that can be used for programming because a high current may damage the transistors or diodes acting as access transistors for the memory cells.

In light of the foregoing, there is a need for a memory cell structure that enables selective access to the core cells without the need of an access transistor.

SUMMARY OF THE INVENTION

Broadly speaking, the present invention enables the access transistor, which is also referred to as a steering element, for accessing a memory core cell to be eliminated through the use of a threshold changing material that can be programmed to function as a steering element.

In accordance with one aspect of the present invention, a memory core is provided. The memory core includes a bit line and a word line. A core cell in electrical communication with the word line and the bit line is included. The core cell includes a threshold changing material. The threshold changing material is programmed to enable access to the core cell based upon a voltage applied to the word line.

In one embodiment, the threshold changing material is associated with transistor like properties enabling the memory core to function as both a steering device and a memory device. In one embodiment, the threshold material is programmed by either a floating technique or a bias technique.

In accordance with another aspect of the present invention, a method for providing access to a memory core cell is provided. The method initiates with determining a threshold voltage for access to a memory core cell. Then, a threshold changing material of the memory core cell is programmed to enable access to the memory core cell at the threshold voltage. Next, a voltage is applied to a word line in communication with the memory core cell. If the voltage is at least as large as the threshold voltage, then the method includes accessing the memory core cell.

In accordance with yet another aspect of the present invention, a method for reading a chalcogenide memory device is provided. The method initiates with applying a read voltage to a word line. The read voltage is configured to directly access the chalcogenide memory device. Then, a zero bias is applied on the bit line corresponding to the word line. Next, a value stored in the chalcogenide memory device is read.

It will be apparent to those skilled in the art that the method of adjusting the $V_{th}$ of the present invention can be applied in numerous memory/solid state device applications. One of the significant advantages of the memory core is the elimination of access transistors that function as steering elements for signals to the memory core cells.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF EXEMPLARY EMBODIMENTS

Several exemplary embodiments of the invention will now be described in detail with reference to the accompanying drawings.

In accordance with the present invention, a threshold changing material is incorporated into a memory cell in order to eliminate the need for access transistors. In one embodiment, the threshold changing material is a chalcogenide material. Further information on adjusting the threshold voltage, $V_{th}$, of a material capable of changing $V_{th}$ is discussed in related U.S. patent application Ser. No. 10/465,120, filed on even date herewith, and entitled "Method for Adjusting the Threshold Voltage for a Memory Cell." The disclosure of this related application is incorporated herein by reference for all purposes. In one embodiment, the transistor-like properties of the threshold changing material are exploited to simplify the memory cell structure by enabling the elimination of the steering element, e.g., the access transistor or P-N diode. It will be apparent to one skilled in the art that the chalcogenide memory cell may be embedded with logic circuits to form a system on a chip (SoC). Furthermore, with respect to chalcogenide, the non-volatile nature once programmed, enables for relatively fast reading and writing operations. It should be appreciated that the programming voltage associated with a threshold changing material, e.g., a chalcogenide material, is much lower than that of a flash read only memory (ROM). For example, the programming voltage associated with a chalcogenide memory cell is about 5 volts (V) as compared to a programming voltage of about 10 V for a flash ROM.

The chalcogenide memory cell is capable of functioning as both a steering device and memory device. Accordingly, the fabrication of just a chalcogenide memory cell is much easier than combining both a transistor and a chalcogenide memory cell. Additionally, where the memory cell also acts as a steering device, enables a reduction in the chip size for the same amount of memory as compared to a memory having separate steering devices and memory cells. Alternatively, a dual functioning chalcogenide memory may be able to provide more memory capacity as compared to memories having separate steering devices and memory cells. As discussed herein, a minimum-sized chalcogenide memory device is capable of passing a higher current as compared to an access transistor. It should be appreciated that while a chalcogenide material is used as an example of a threshold changing material, the embodiments described herein are not limited to a chalcogenide material. That is, any suitable material having the desirable characteristics of a chalcogenide material, i.e., having stable and tunable voltage threshold ($V_{th}$) properties, may serve as a nonvolatile dual function memory cell.

Figure 1:
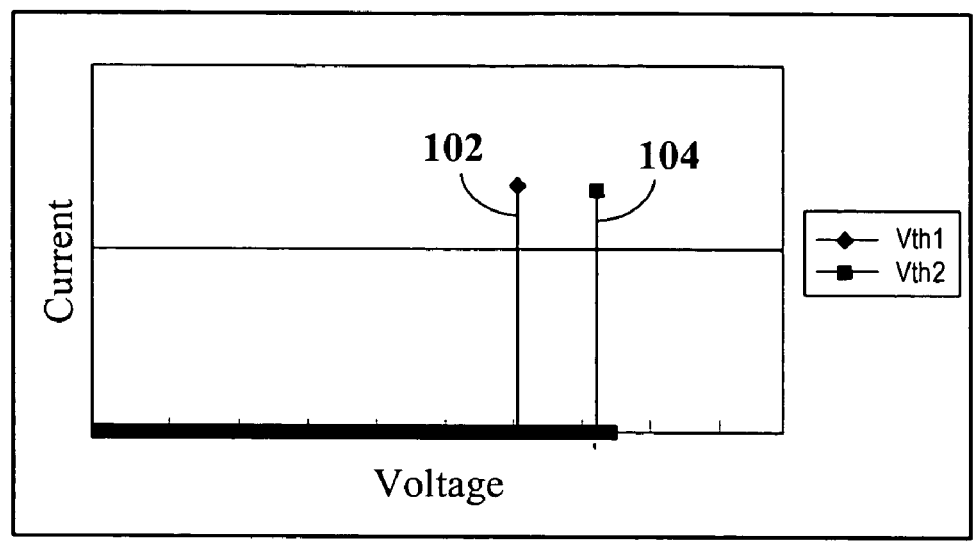
FIG. 1 is an I-V curve of chalcogenide memory cells associated with different $V_{th}$.

FIG. 1 is an I-V curve of chalcogenide memory cells associated with different $V_{th}$. As discussed in the above-mentioned related application (application Ser. No. 10/465,120), the $V_{th}$ of chalcogenide may be adjusted by applying energy into the film. Therefore, there can be chalcogenide memory cells having different $V_{th}$ within a memory core. Because the device can pass high current when voltage is below $V_{th}$ and can block current when voltage is below $V_{th}$, the device is capable of serving as an active steering device. It should be appreciated that because the $V_{th}$ is capable of being tuned and the $V_{th}$ is stable after programming, the cell can serve as a nonvolatile memory device. FIG. 1 illustrates a first threshold voltage (Vth1) associated with a memory cell captured by line 102 and a second threshold voltage ($V_{th2}$) associated with a memory cell captured by line 104.

Figure 2:
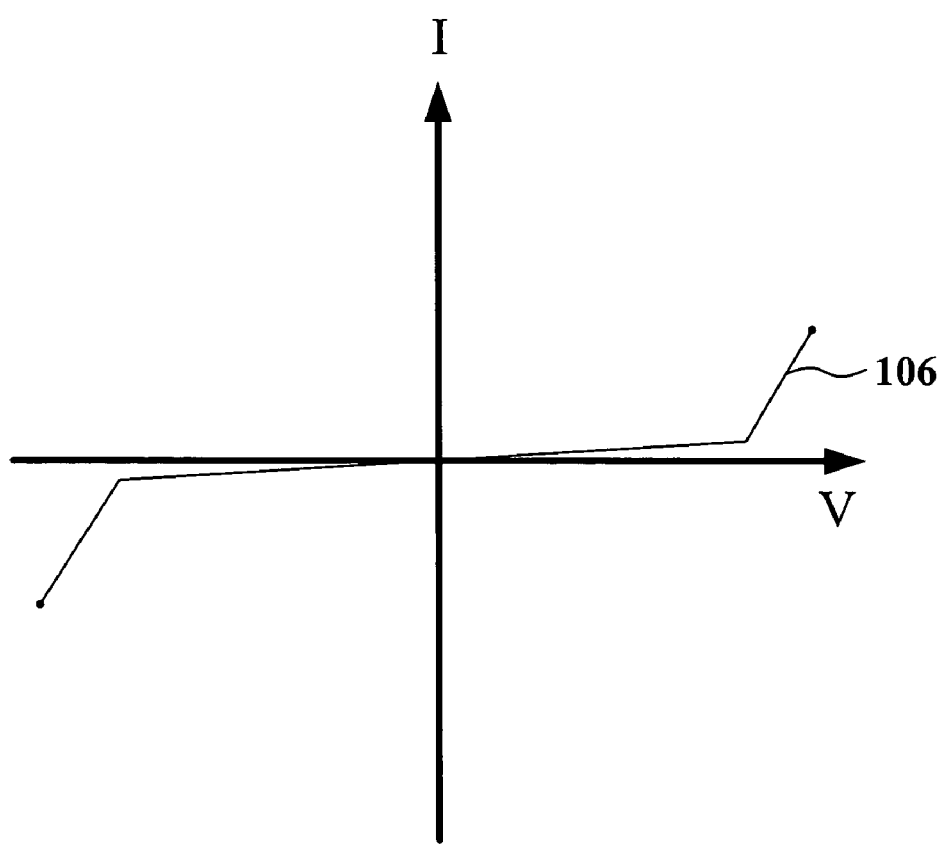
FIG. 2 is a graph representing the symmetric nature of the current (I)-voltage (V) characteristic of a chalcogenide memory device.

FIG. 2 is a graph representing the symmetric nature of the current (I)-voltage (V) characteristic of a chalcogenide memory device. As shown therein, line 106 illustrates the symmetrical nature between the relationship of I and V for the chalcogenide memory device.

Figure 3:
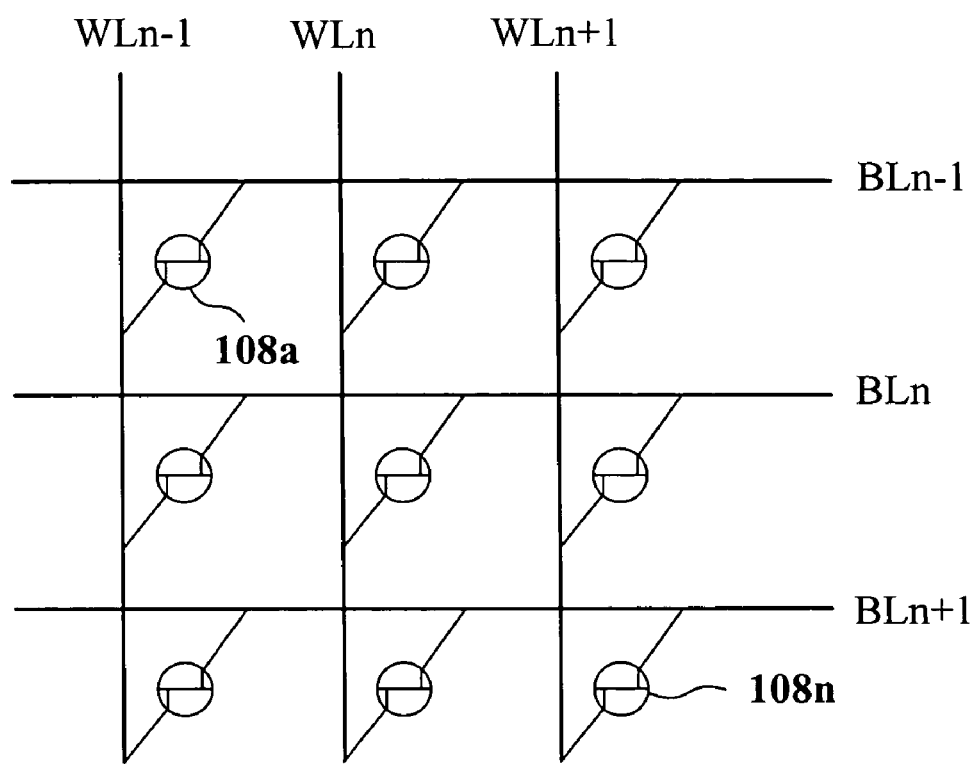
FIG. 3 is a simplified schematic diagram of a memory array having dual function memory cells.

FIG. 3 is a simplified schematic diagram of a memory array having dual function memory cells. Memory cells 108a through 108n are illustrated in the matrix defined by word lines (WLn) WLn−1 to WLn+1 and bit lines BLn−1 to BLn+1. Since the chalcogenide memory cells function as both a memory cell and steering device, there is no need for access transistors.

Figure 4A:
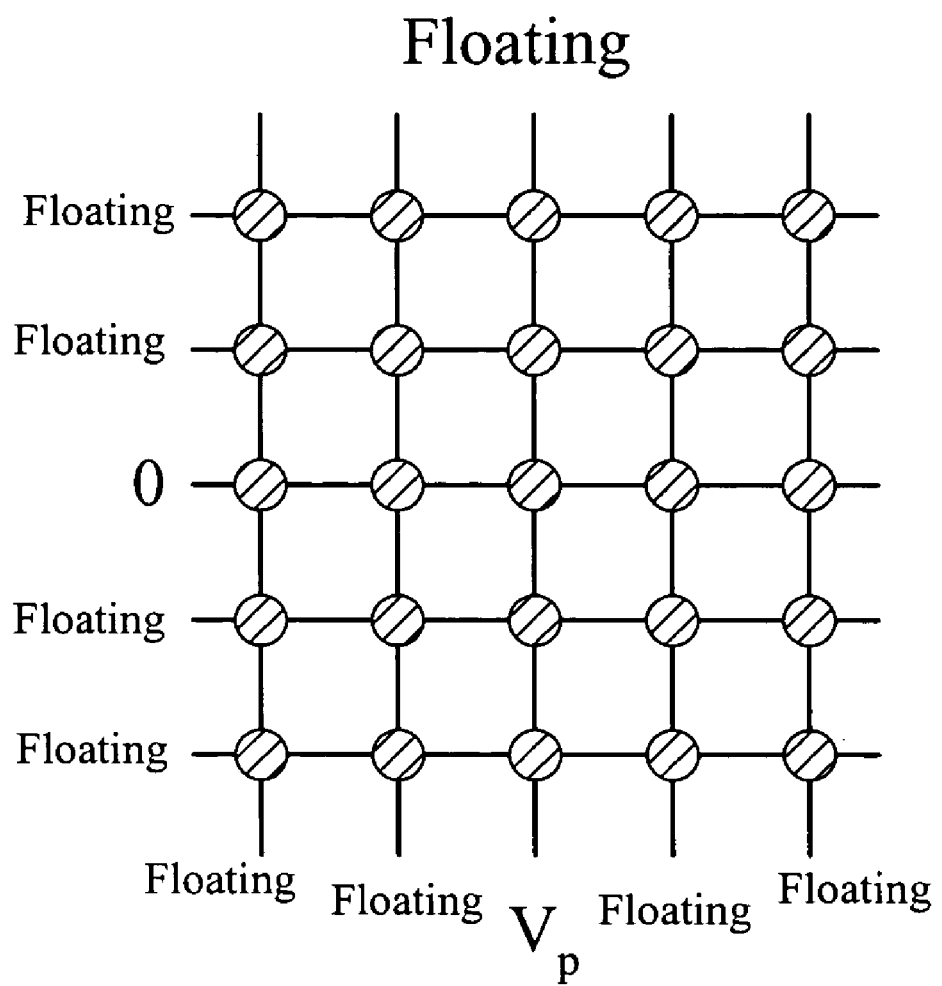
FIGS. 4A through 4D illustrate exemplary plots associated with programming techniques that may be applied to a chalcogenide memory device.

FIGS. 4A through 4D illustrate exemplary plots associated with programming techniques that may be applied to a chalcogenide device. FIG. 4A illustrates a floating programming technique. Here, it is assumed that the chalcogenide memory device includes two voltage thresholds, i.e., a low voltage threshold ($V_{th1}$) as state 1 and a high voltage threshold ($V_{thh}$) state 0. The plot of FIG. 4A illustrates the bias applied and the resulting bias on the cells. The unselected cells are associated with a bias of $-V_p$ to $+V_p$. The selected cell is associated with a forward bias of $+V_p$. Cell 108s represents the selected cell, while the remainder of cells 108a–108n represent the unselected cells. Table 1 below summarizes the programming method for program 1 and program 0.

TABLE 1

|  | Program 1 | Program 0 |
| --- | --- | --- |
| Selected Bit line | 0 | 0 |
| Other Bit line | Floating | Floating |
| Selected Word line | $V_{p1}$ | $V_{ph}$ |
| Other Word line | Floating | Floating |

As summarized in Table 1, the selected bit line is zero, while the selected word line is dependent upon the program or state selected, i.e., $V_{p1}$ or $V_{ph}$.

Figure 4B:
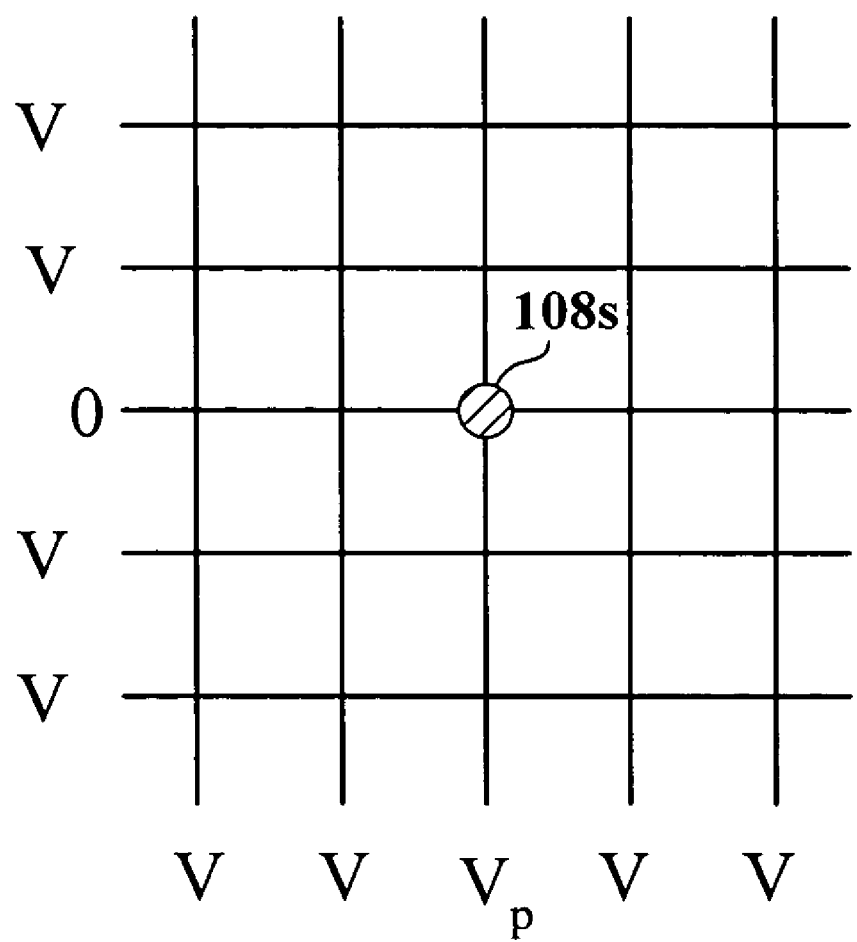

FIG. 4B illustrates a biased programming technique. The plot of FIG. 4B illustrates the bias applied. Here, a voltage (bias) may be applied on the unselected word lines and bit lines. The selected cell 108s is associated with a forward bias of $+V_p$. It may be assumed that the chalcogenide memory device includes two voltage thresholds, i.e., a low voltage threshold ($V_{th1}$) as state 1 and a high voltage threshold ($V_{thh}$) state 0. The programming method for states 1 and 0 is listed in Table 2 below.

TABLE 2

|  | Program 1 | Program 0 |
| --- | --- | --- |
| Selected Bit line | 0 | 0 |
| Other Bit line | $0 \leq V \leq V_{p1}$ | $0 \leq V \leq V_{ph}$ |
| Selected Word line | $V_{p1}$ | $V_{ph}$ |
| Other Word line | $0 \leq V \leq V_{p1}$ | $0 \leq V \leq V_{ph}$ |

As summarized in Table 2, the selected bit line is zero, while the selected word line is dependent upon the program or state selected, i.e., $V_{p1}$ or $V_{ph}$. It should be appreciated that two exemplary types of bias programming methods may be used, i.e., the V/2 method and the V/3 method, illustrated in FIGS. 4C and 4D, respectively. Of course, other bias programming methods may be used as the methods illustrated herein are exemplary and not meant to be limiting.

Figure 4C:
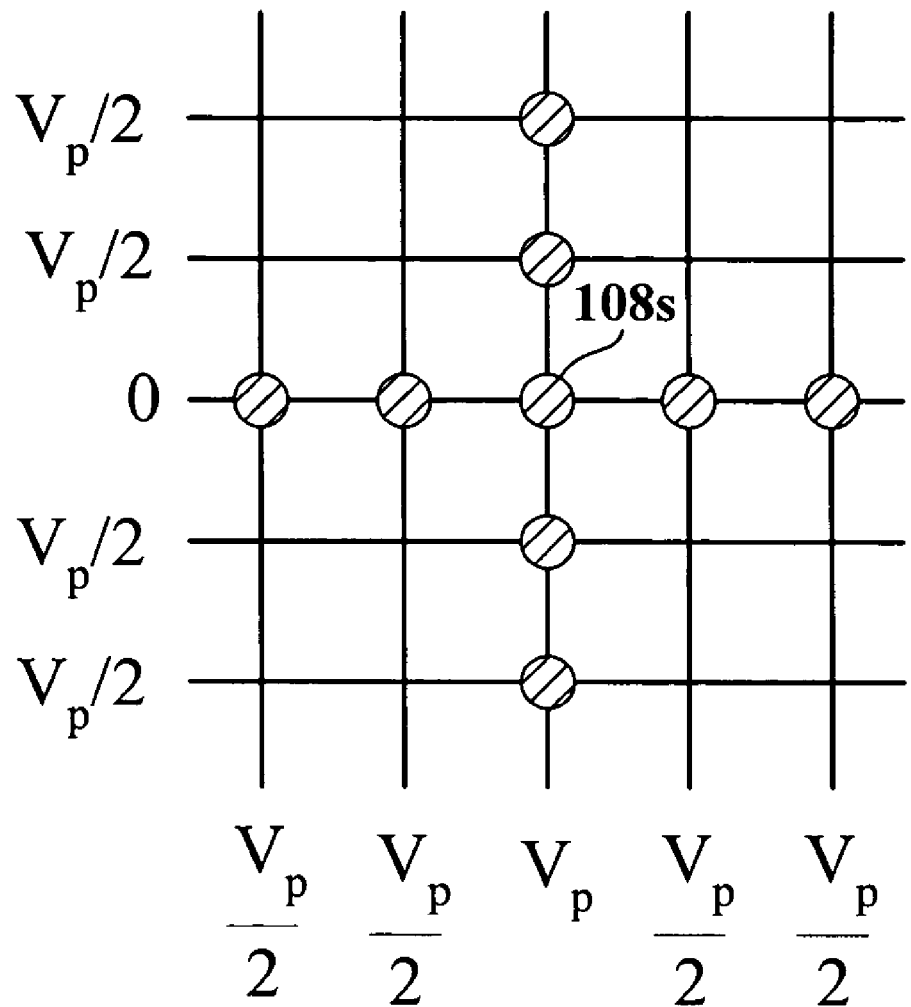

FIG. 4C illustrates a plot of the V/2 method. The plot of FIG. 4C illustrates the bias applied and the resulting bias on the cell. The selected cell 108s is associated with a forward bias of $+V_p$ while the remaining unselected cells are associated with a forward bias of $+V_p/2$. It may be assumed that the chalcogenide memory device includes two voltage thresholds, i.e., a low voltage threshold ($V_{th1}$) as state 1 and a high voltage threshold ($V_{thh}$) state 0. The programming method for states 1 and 0 is listed in Table 3 below.

TABLE 3

|  | Program 1 | Program 0 |
| --- | --- | --- |
| Selected Bit line | 0 | 0 |
| Other Bit line | $V_{p1}/2$ | $V_{ph}/2$ |
| Selected Word line | $V_{p1}$ | $V_{ph}$ |
| Other Word line | $V_{p1}/2$ | $V_{ph}/2$ |

As summarized in Table 3, the selected bit line is zero, while the selected word line is dependent upon the program or state selected, i.e., $V_{p1}$ or $V_{ph}$.

Figure 4D:
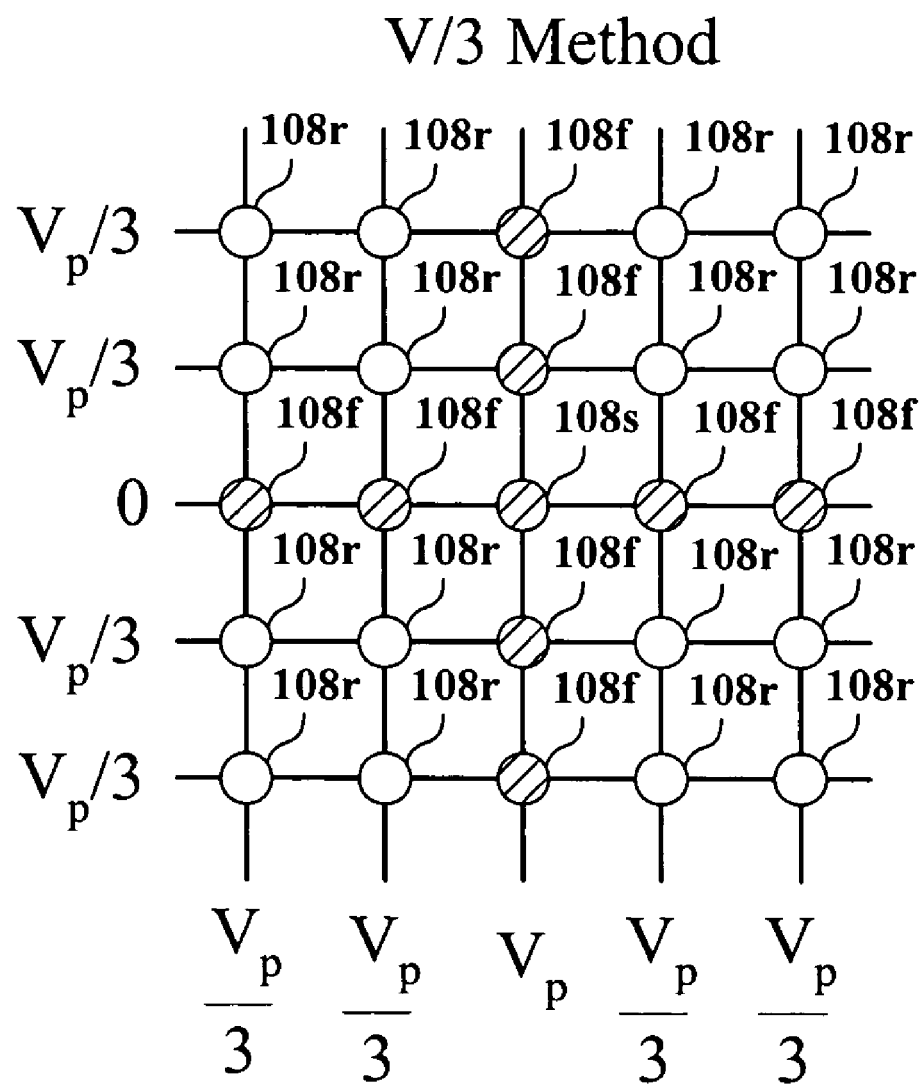

FIG. 4D illustrates a plot of the V/3 method. The plot of FIG. 4D illustrates the bias applied and the resulting bias on the cell. The selected cell 108s is associated with a forward bias of $+V_p$ while the remaining unselected cells fall into one of two characterizations, i.e., those associated with a forward bias and those associated with a reverse bias. Cells 108f are associated with a forward bias of +$V_p$/3, while cells 108r are associated with a reverse bias of -$V_p$/3. It may be assumed that the chalcogenide memory device includes two voltage thresholds, i.e., a low voltage threshold ($V_{th1}$) as state 1 and a high voltage threshold ($V_{thh}$) state 0. The programming method for states 1 and 0 is listed in Table 4 below.

TABLE 4

|  | Program 1 | Program 0 |
| --- | --- | --- |
| Selected Bit line | 0 | 0 |
| Other Bit line | 2$V_{pl}$/3 | 2$V_{ph}$/3 |
| Selected Word line | $V_{pl}$ | $V_{ph}$ |
| Other Word line | $V_{pl}$/3 | $V_{ph}$/3 |

As summarized in Table 4, the selected bit line is zero, while the selected word line is dependent upon the program or state selected, i.e., $V_{p1}$ or $V_{ph}$. It should be appreciated that the limit of the programming voltage may be represented as: $V_{th}$ high<Vp<3Vth low.

The reading methods include a floating method and a bias method. The floating method refers to a bias $V_r$ that is applied between $V_{th1}$ and $V_{thh}$ on the selected word line (or bit line) and zero bias on the selected word line (or bit line). Other word lines and bit lines are floating. The bias method refers to a bias $V_r$ that is applied between $V_{th1}$ and $V_{thh}$ on the selected word line (or bit line) and zero bias on the selected word line (or bit line). Other word lines and bit lines apply a certain bias of 0<V<$V_{th1}$. Two illustrative bias methods, V/2 method and V/3 method were presented.

Figures 5A, 5B, 5C:
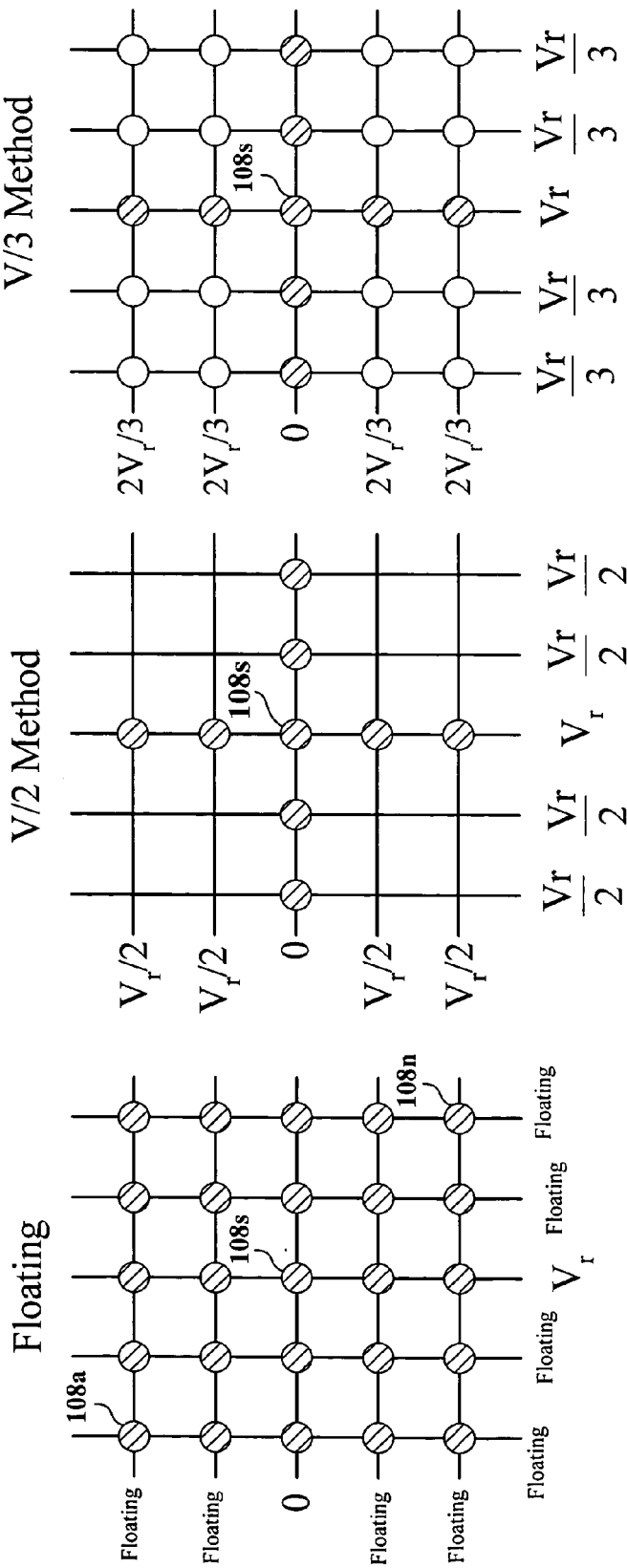
FIGS. 5A through 5C illustrate three exemplary methods for reading a device.

FIGS. 5A through 5C illustrate three exemplary methods for reading a device. Each of FIGS. 5A–5C represents the bias applied and the resulting bias on the cells. FIG. 5A represents a floating method where the bias is -$V_r$->+$V_r$ and selected cell 108s is associated with a forward bias of +$V_r$. FIG. 5B represents a V/2 reading method. Selected cell 108s is associated with a forward bias of +$V_r$. The remaining unselected cells of FIG. 5B are associated with a forward bias of +$V_r$/2. FIG. 5C represents a V/3 reading method. Selected cell 108s is associated with a forward bias of +$V_r$. The remaining unselected cells of FIG. 5C are associated with either a forward bias of +$V_r$/3 or a reverse bias of -$V_r$/3. It should be appreciated that the unselected cells form a similar pattern as discussed above with reference to FIG. 4D.

In summary, the present invention provides a memory core that eliminates the need for access transistors providing access to the core cells. That is, the access to the core cells may be accomplished through the programming of the core cells when the core cells incorporate a threshold changing material, e.g., a chalcogenide material. In essence, the steering element is now accomplished through the programming of the threshold changing material. One skilled in the art will appreciate that the elimination of the access transistors also provides for simplified decode logic as signals for the access transistors are no longer necessary for the embodiments described herein.

The invention has been described herein in terms of several exemplary embodiments. Other embodiments of the invention will be apparent to those skilled in the art from consideration of the specification and practice of the invention. The embodiments and preferred features described above should be considered exemplary, with the scope of the invention being defined by the appended claims and their equivalents.

What is claimed is:

1. A memory core, comprising:
   a word line;
   a bit line; and
   a core cell having two terminals, one terminal being electrically connected to the word line and the other terminal being electrically connected to the bit line, the core cell including a threshold changing material, the threshold changing material programmed by one of a floating technique and a bias technique to enable access to the core cell based upon a voltage applied to the word line, and the threshold changing material being configured to act as a steering device and a storage device;
   wherein the floating technique is associated with zero bias on the word line and remaining word lines are floating, and wherein the bias technique is associated with zero bias on the word line and remaining word lines apply a bias between about zero and about a low threshold voltage.

2. The memory core of claim 1, wherein the core cell is configured to provide a nonvolatile memory.

3. The memory core of claim 1, wherein the threshold changing material is a chalcogenide material.

4. The memory core of claim 1, wherein the threshold changing material is read by one of a floating technique and a bias technique.

5. The memory core of claim 1, wherein the core cell is one core cell of an array of core cells, each of the core cells exploiting transistor properties of the threshold changing material in order to determine signal access to each of the core cells.

6. A method for providing access to a memory core cell having two terminals, the memory core cell being coupled to a word line and a bit line, comprising:
   determining a threshold voltage for access to a memory core cell;
   programming a threshold changing material of the memory core cell through the two terminals such that steering access to the memory core cell is enabled when at the threshold voltage, the programming of the threshold changing material of the memory core cell including either applying a floating technique or applying a bias technique;
   applying a voltage to the word line coupled to the memory core cell; and
   if the voltage is at least as large as the threshold voltage, accessing the memory core cell.

7. The method of claim 6, wherein the programming of a threshold changing material of the memory core cell to enable access to the memory core cell at the threshold voltage includes:
   applying a floating technique.

8. The method of claim 6, wherein the programming of a threshold changing material of the memory core cell to enable access to the memory core cell at the threshold voltage includes:
   applying a bias technique.

9. The method of claim 6, further comprising:
   if the voltage is less than the threshold voltage, denying access to the memory core cell.

10. The method of claim 6, wherein the threshold changing material is a chalcogenide material.

11. The method of claim 6, wherein the memory core cell is a nonvolatile memory core cell.

12. A method for reading a chalcogenide memory device, comprising:

applying a read voltage to a word line, the read voltage configured to directly access the chalcogenide memory device having combined steering and storage capabilities when programmed to have a programmed threshold voltage;

applying a zero bias on a bit line corresponding to the word line, the chalcogenide memory device being directly coupled to the word line and the bit line; and reading a value stored in the chalcogenide memory device when the read voltage is at least as high as the programmed threshold voltage, wherein a threshold changing material of the chalcogenide memory device is programmed to have the programmed threshold voltage by one of a floating the technique and a bias technique to enable access to a core cell based upon a voltage applied to the word line, the floating technique being associated with zero bias on the word line and remaining word lines are floating, and the bias technique being associated with zero bias on the word line and remaining word lines apply a bias between about zero and about a low threshold voltage.

13. The method of claim 12, further comprising:
maintaining both remaining word lines and remaining bit lines in a floating state.

14. The method of claim 12, further comprising:
applying a bias voltage to both remaining word lines and remaining bit lines.

15. The method of claim 14, wherein the bias voltage is less than a threshold voltage.

16. The method of claim 14, wherein the bias voltage is about one half of the read voltage, about one third of the read voltage, or about two thirds of the read voltage.

* * * * *